(12) United States Patent
Boker

(10) Patent No.: US 7,121,473 B2
(45) Date of Patent: Oct. 17, 2006

(54) SECURITY MEMORY CARD AND PRODUCTION METHOD

(75) Inventor: Thorsten Boker, Beijing (CN)

(73) Assignee: Infeneon Technologies Flash GmbH & Co., Dresden (DE)

( * ) Notice: Subject to any disclaimer, the term of this patent is extended or adjusted under 35 U.S.C. 154(b) by 74 days.

(21) Appl. No.: 10/769,286

(22) Filed: Jan. 30, 2004

(65) Prior Publication Data

US 2004/0211843 A1    Oct. 28, 2004

(30) Foreign Application Priority Data

Jan. 30, 2003   (DE) ................ 103 03 740

(51) Int. Cl.
*G06K 19/06* (2006.01)
(52) U.S. Cl. ...................... 235/492; 235/375
(58) Field of Classification Search ................ 235/492, 235/375, 380, 486; 361/737, 761
See application file for complete search history.

(56) References Cited

U.S. PATENT DOCUMENTS

| | | | | |
|---|---|---|---|---|
| 5,969,329 A * | 10/1999 | Vallat | ........................ | 235/475 |
| 6,273,335 B1 * | 8/2001 | Sloan | ......................... | 235/382 |
| 6,313,524 B1 * | 11/2001 | Pueschner et al. | .......... | 257/698 |
| 6,496,381 B1 * | 12/2002 | Groeger | ...................... | 361/761 |
| 6,719,206 B1 * | 4/2004 | Bashan et al. | .............. | 235/492 |
| 6,817,534 B1 * | 11/2004 | Gray | .......................... | 235/492 |
| 6,824,063 B1 * | 11/2004 | Wallace et al. | ............. | 235/487 |
| 2004/0223305 A1 * | 11/2004 | Amiot et al. | ............... | 361/737 |

FOREIGN PATENT DOCUMENTS

| | | |
|---|---|---|
| DE | 199 08 285 A1 | 8/2000 |
| DE | 199 06 569 A1 | 9/2000 |
| DE | 199 47 162 C1 | 9/2000 |
| DE | 199 43 060 C1 | 11/2000 |
| DE | 100 19 431 A1 | 10/2001 |
| DE | 101 14 286 A1 | 10/2002 |

* cited by examiner

*Primary Examiner*—Ahshik Kim
(74) *Attorney, Agent, or Firm*—Dickstein, Shapiro, LLP.

(57) ABSTRACT

A microcontroller and a memory having a large storage capacity are arranged in a module having a thickness of a smart card and lateral dimensions reduced in comparison therewith, and also has first connection pads (as used for smart cards) and second connection pads consistent with an extended functionality provided for a MultiMediaCard or 9-pin SD, for example. The module is personalized with an apparatus provided for smart cards and is used in a housing for a standardized memory card.

11 Claims, 7 Drawing Sheets

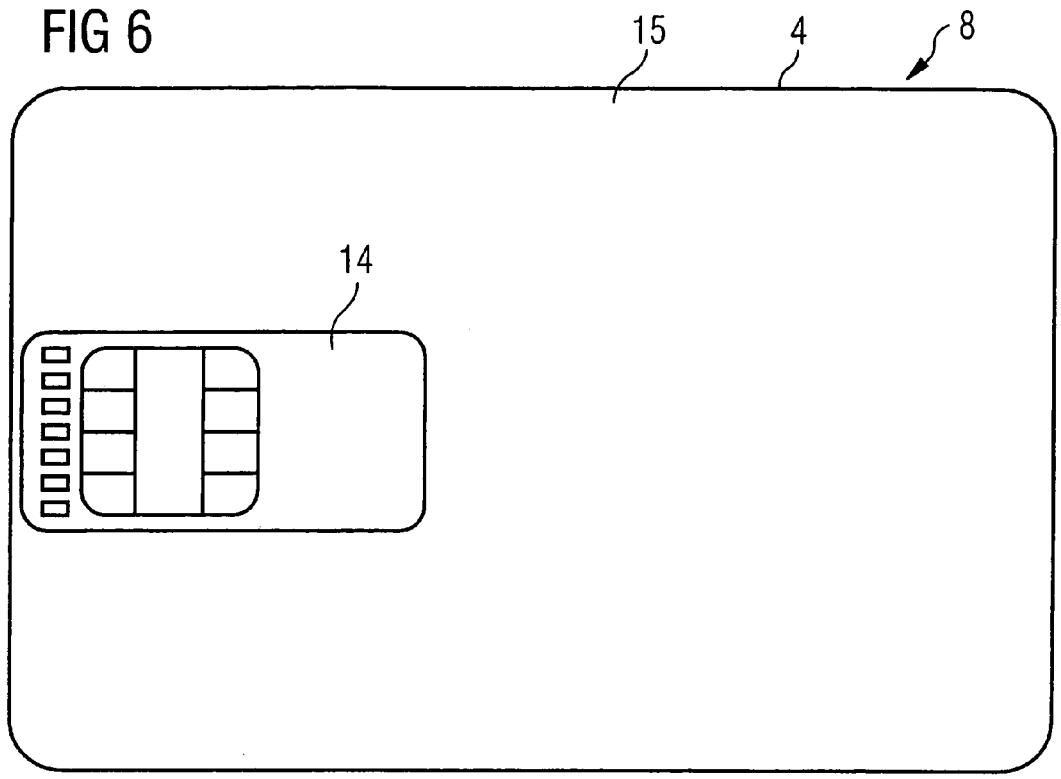
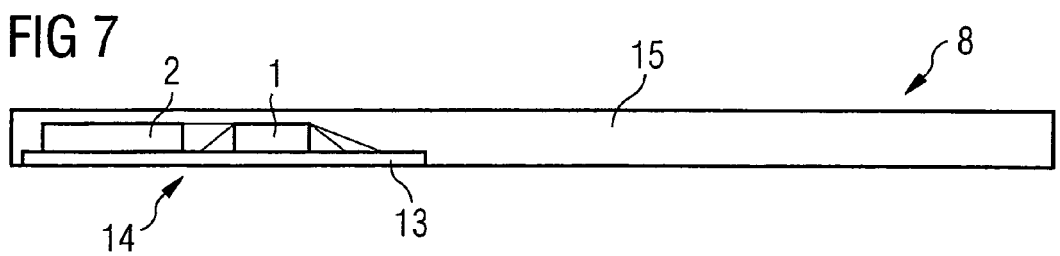
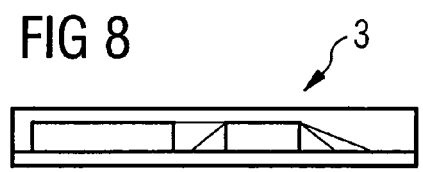
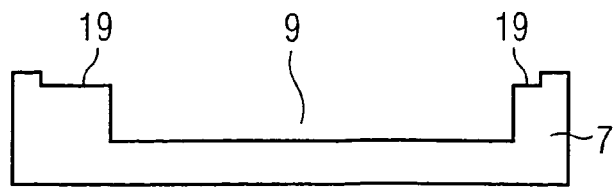

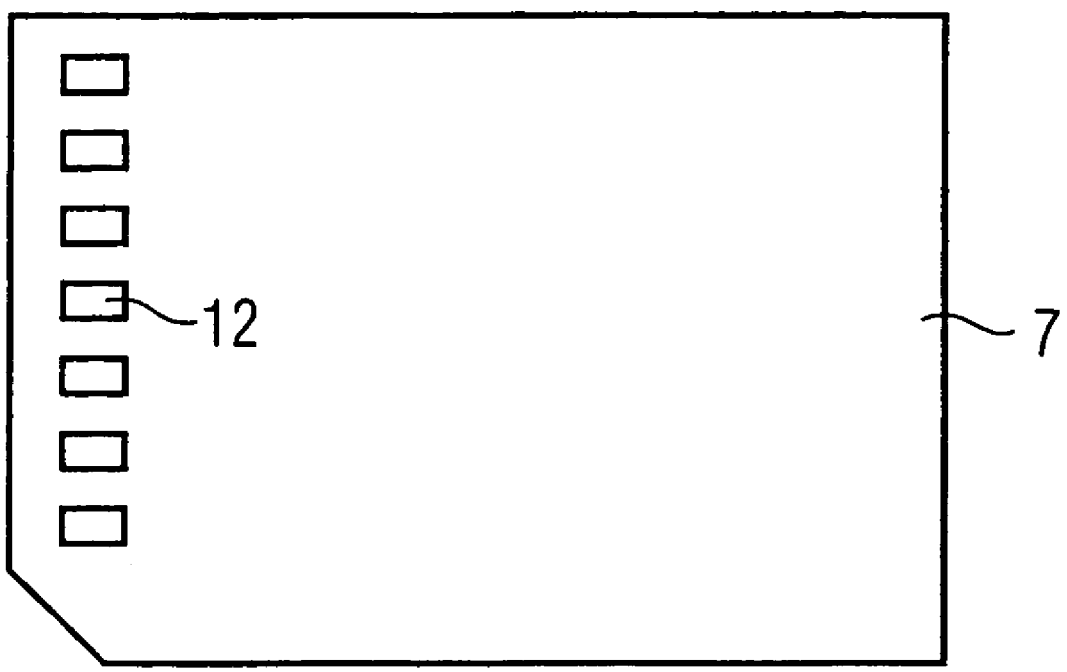
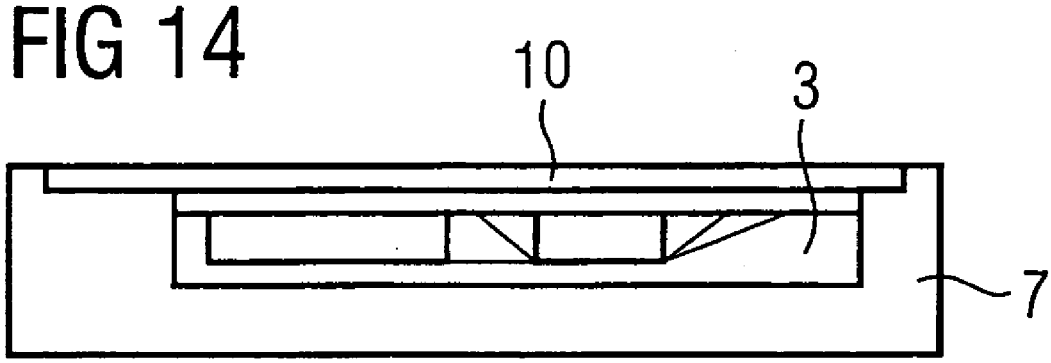

SECURITY MEMORY CARD AND PRODUCTION METHOD

CROSS-REFERENCE TO RELATED APPLICATIONS

This application claims priority from German Patent Application No. 10303740.3 filed Jan. 30, 2003, the subject matter of which is incorporated herein by reference in its entirety.

FIELD OF THE INVENTION

The present invention relates to security memory cards, and in particular, security memory cards with large storage volume.

BACKGROUND OF THE INVENTION

In comparison with chip cards, specifically with the smart card, a MultiMediaCard is distinguished by a significantly larger storage capacity. Unlike the smart card, however, there is no personalization facility allowing use of the card to be restricted to a limited group of people or allowing the card user to be identified. Such personalization takes place on smart cards in specially provided apparatuses which are matched to the standardized chip card formats, particularly ID-1 or ID-000 in line with ISO7816.

If MultiMediaCards are to be used for particular security-critical applications, they need to be personalized in the same way as the smart cards. To change over the conventional apparatuses to MultiMediaCards, considerable effort is required which is linked to considerable costs. It would therefore be desirable to have a way of personalizing MultiMediaCards easily and inexpensively as well.

SUMMARY OF THE INVENTION

It is an object of the present invention to specify a security memory card for large storage volumes, particularly in the form of a MultiMediaCard, which is personalized and can be produced easily. The aim is also to specify an associated production method.

In the case of this security memory card, a microcontroller component and a memory component having a large storage capacity are arranged in a module which has a thickness in line with a format standardized for the external dimensions of smart cards and lateral dimensions which are reduced in comparison with such a format. This module has connection pads in line with a format standardized for smart cards in accordance with ISO and also further connection pads in line with an extended functionality provided for a MultiMediaCard or 9-pin SD Card (Secure Digital), for example. A memory card within the meaning of the invention is respectively to be understood to mean a chip card having extended functionality and/or an enlarged storage volume, such as a MultiMediaCard or a Secure Digital Card. The module can be formed by a segment of a smart card, in particular. In comparison with a conventional smart card, it then differs only by the further connection pads. The microcontroller component and the memory component can be arranged on two separate semiconductor chips or integrated in a common semiconductor chip.

To produce this security memory card, such a module is personalized, possibly within a complete card body for a smart card. The module is then arranged, if appropriate with previously reduced lateral dimensions, in a housing standardized for a memory card, for example a MultiMediaCard or 9-pin SD Card. This is preferably done by inserting the module into such a housing having a cutout provided so as to match the module. Preferably, a cover is fitted which covers the contacts from the smart card's standard which are used for personalization, so that only the further connection pads provided for the functionality of the MultiMediaCard or SD Card can be connected externally. In the case of one preferred exemplary embodiment of the MultiMediaCard, an outer side of the cover has external connection pads in line with a format standardized for the MultiMediaCard which are electrically conductively connected to the further connection pads in the module through the cover. In the case of one preferred exemplary embodiment of the SD Card, one edge of the cover has openings through which it is possible to connect the further connection pads, which are already provided as external connection pads.

BRIEF DESCRIPTION OF THE DRAWINGS

A more precise description of examples of the security memory card and of the production method is given with reference to FIGS. 1 to 20.

FIG. 6 shows a smart card with an inserted chip card module in plan view.

FIG. 7 shows the smart card shown in FIG. 6 in cross section.

FIG. 8 shows the module as a segment from the smart card shown in FIGS. 6 and 7 in cross section.

FIG. 9 shows a cross section through a housing provided for a MultiMediaCard.

FIG. 13 shows a plan view of the top side of the finished security MultiMediaCard.

FIG. 14 shows a cross section through the security MultiMediaCard.

DETAILED DESCRIPTION OF THE PREFERRED MODE OF THE INVENTION

Figure 1:
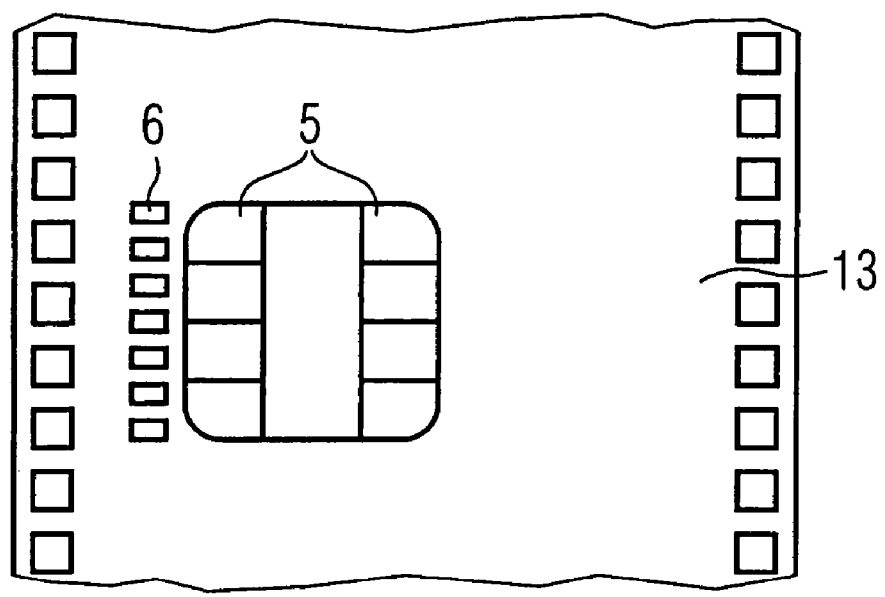
FIG. 1 shows a segment from an underside of a support strip.

FIG. 1 shows a plan view of an underside of a support strip. A respective portion of the support strip is used as support 13 for a respective chip card module. Fitted on and in this support strip are electrical contacts which form connection pads 5 standardized for chip cards or smart cards on the underside shown. In this case, further connection pads 6 are provided for the specific functions of a MultiMediaCard.

Figure 2:
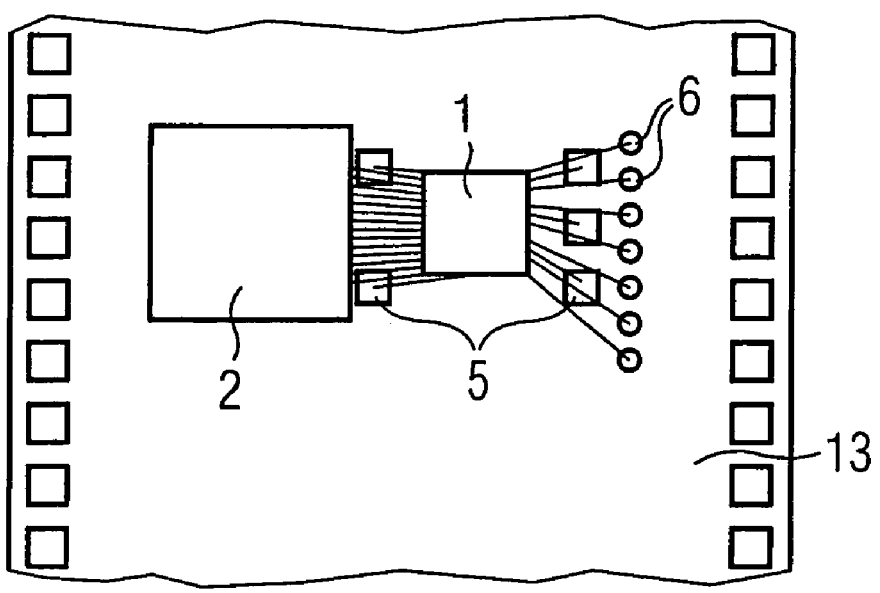
FIG. 2 shows a segment from the top side of the support strip with fitted components.

FIG. 2 shows a plan view of the support 13 from the top side, on which a microcontroller component 1 and a memory component 2 having a large storage capacity are fitted, e.g., bonded, and in this exemplary embodiment are electrically conductively connected to the connection pads 5 and further connection pads 6 by means of bonding wires.

Figure 3:
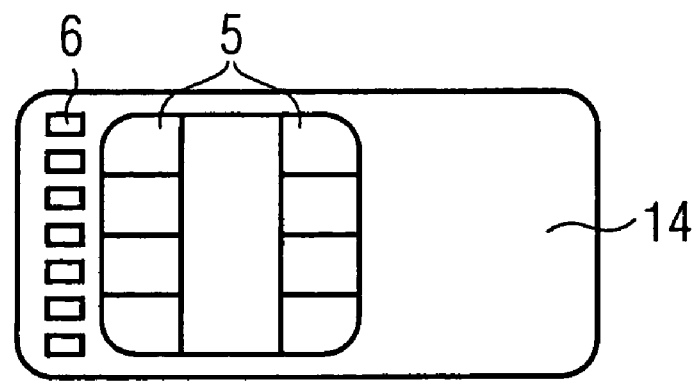
FIG. 3 shows a plan view of the underside of a chip card module.

FIG. 3 shows a chip card module 14 which is produced by cutting out a segment of corresponding size from the support strip, so that a component having the dimensions shown in FIG. 3 is roughly produced.

Figure 4:
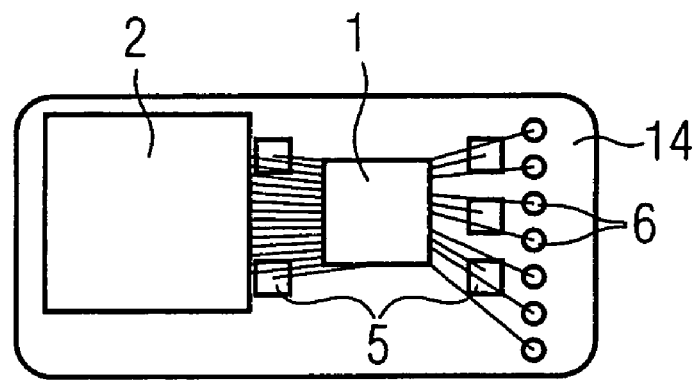
FIG. 4 shows a plan view of a top side of the chip card module shown in FIG. 3.

FIG. 4 shows this chip card module 14 from the top side, on which the microcontroller component 1 and the memory component 2 are fitted.

Figure 5:
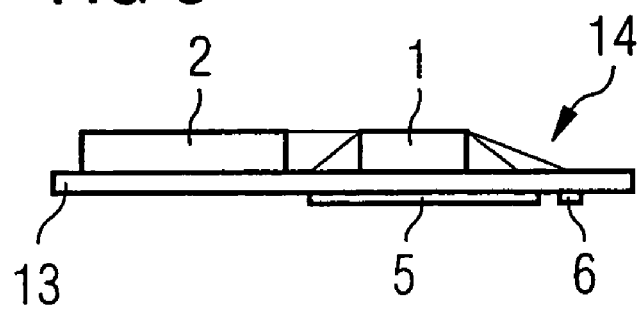
FIG. 5 shows the chip card module shown in FIGS. 3 and 4 in a side view.

FIG. 5 shows this chip card module 14 in a side view, which also schematically shows the electrical connections between the components and between the connection contacts on the components and the connection pads 5, 6 on the support 13.

FIG. 6 shows an arrangement for the chip card module 14 in a housing 4 standardized for smart cards, for example in a card body 15 made of plastic or a laminate comprising a plurality of layers. The housing 4 has, by way of example, the ID-1 format with a width of no less than 85.46 mm (3.365 inches) and no more than 85.72 mm (3.375 inches) and a height of no less than 53.92 mm (2.123 inches) and no more than 54.03 mm (2.127 inches). It is thus possible to form a complete smart card 8 with the chip card module 14.

FIG. 7 shows the smart card 8 shown in FIG. 6 in cross section, said smart card having a thickness of 0.76 mm (0.03 inch). From this cross section, it is also possible to see the position of the chip card module 14 within the card body. The chip card module 14 is preferably inserted into the card body such that the microcontroller component 1 and the memory component 2 are arranged inside a cutout, preferably in a neutral fiber of the chip card body, and the support 13 forms a portion of an external top side. This arrangement of a chip card module 14 in a card body is known per se. It is sufficient for the embodiment of the invention if the chip card module 14 is fitted in this manner in a housing which largely corresponds to a chip card or smart card at least such that the conventional apparatuses for personalizing chip cards or smart cards can also be used to personalize the chip card module 14 fitted in said housing.

In the present form as a smart card 8 or at least within a card body of sufficient dimensions, particularly with the standardized thickness of 0.76 mm, the chip card module 14 can be personalized using an apparatus which is already provided for smart cards. This is done in a manner which is known per se using ordinary cryptoalgorithms or the like. The effect achieved by this is that a user of a smart card can be identified from data which have been input which are compared directly or following computerized conversion with stored data, or use can be restricted to one person or to a particular group of people by means of particular code words or other protective devices. This is known per se from smart cards.

Next, the module 3 provided for the security memory card is produced, this module being shown in FIG. 8. This may require suitable reduction of the lateral dimensions of the chip card module 14 integrated in the chip card housing; the module 3 thus needs to be cut out of the smart card 8, for example. The module 3 then has the same standardized thickness as the housing 4, in this example the thickness of 0.76 mm in line with the format of a smart card. The lateral dimensions of the module 3 can specifically match the lateral dimensions of the original chip card module 14; the lateral dimensions of the module 3 may also differ therefrom, however. In the illustration in FIGS. 3 to 5 and 8 to 10, it is assumed that, in the case of the exemplary embodiment described, the chip card module 14 and the module 3 provided for the security memory card have the same lateral dimensions and differ from one another only by the additional housing portion of the smart card 8.

FIG. 9 shows a cross section of a housing 7 of thickness 1.4 mm which is standardized for MultiMediaCards. The housing is provided with a cutout 9 having dimensions corresponding to those of the module 3 or slightly larger, particularly with a depth of 0.76 mm, into which the module 3 can be inserted. Preferably, the top edge of the cutout 9 has a shoulder 19 above which the cutout has larger lateral dimensions, so that a cover can be inserted at that point in a subsequent step.

Figure 10:
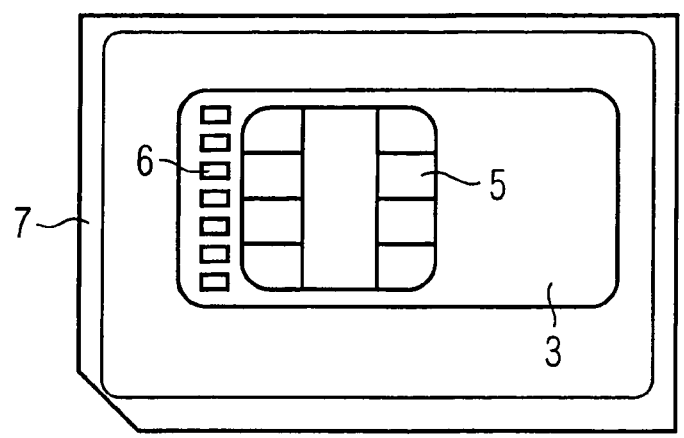
FIG. 10 shows a plan view of the housing provided for a MultiMediaCard, with an inserted module.

FIG. 10 shows a plan view of the housing 7 with the module 3 inserted therein, the connection pads 5 and the further connection pads 6 being arranged on the outer side. External connection pads in line with the format provided for the security memory card, for example in the form of a MultiMediaCard, are preferably fitted on a cover.

Figure 11:
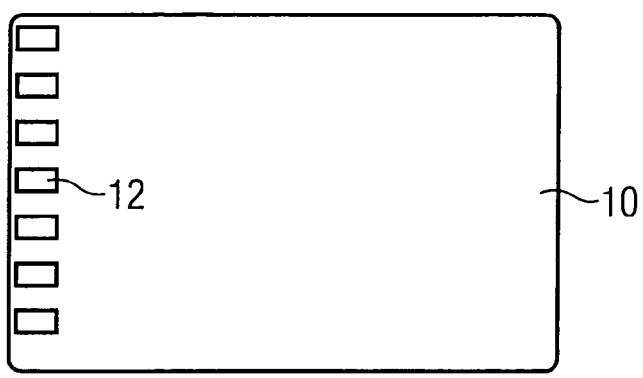
FIG. 11 shows a plan view of the outer side of the cover.

Such a cover 10 is shown in FIG. 11. When this cover 10 is inserted into the housing 7, the external connection pads 12 are electrically conductively connected to the further connection pads 6 in the module 3. The cover 10 can be a PCB (printed circuit board), in particular. The external connection pads 12 are arranged close to the edge of the housing 7.

Figure 12:
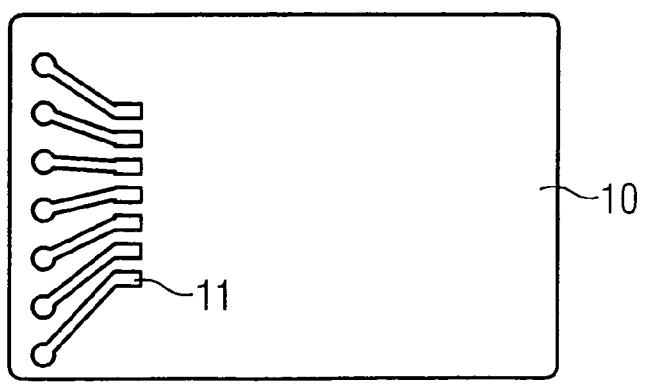
FIG. 12 shows a plan view of the inner side of the cover.

FIG. 12 shows the inner top side (which faces the module 3 when inserted into the housing 7) of the cover 10 with contacts 11 which come into contact with the further connection pads 6 upon insertion. At this point, there are conductor tracks which are routed from these contacts 11 to plated-through holes in the cover 10 which open into the external connection pads 12. This electrically conductive connection between the further connection pads 6 and the external connection pads 12 is particularly easy to produce.

In principle, however, it is also possible to fit the external connection pads 12 on the underside of the housing 7, to provide the contacts 11 on the inner side thereof and to insert the module 3 into the cutout 9 in the housing 7 the opposite way round to the illustration in FIG. 10. Since this means that an underside (opposite the connection pads 5, 6) of the housing of the smart card 8 is arranged on the top side of the housing 7 and the cutout 9 is closed flush with the top side of the housing 7, this embodiment allows a separate cover 10 to be dispensed with if appropriate.

FIG. 13 shows a plan view of the finished security MultiMediaCard in the housing 7 provided therefor which has the external connection pads 12 in the format standardized for MultiMediaCards.

FIG. 14 shows a cross section through this security MultiMediaCard, in which it is possible to see the position of the module 3 and of the cover 10 in the housing 7.

Instead of the seven external connection pads 12 standardized for MultiMediaCards, there may be 9-pin connection pads provided for SD Cards.

Figure 15:
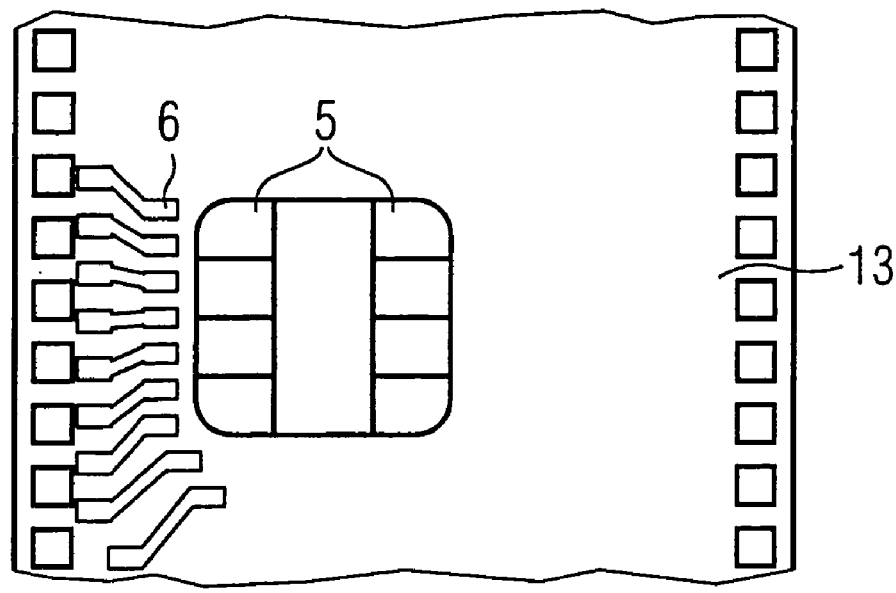
FIG. 15 shows a segment from an underside of a support strip for an alternative exemplary embodiment.

FIG. 15 shows an alternative form of the further connection pads 6 on the support 13, which in this case are provided for an SD Card.

Figure 16:
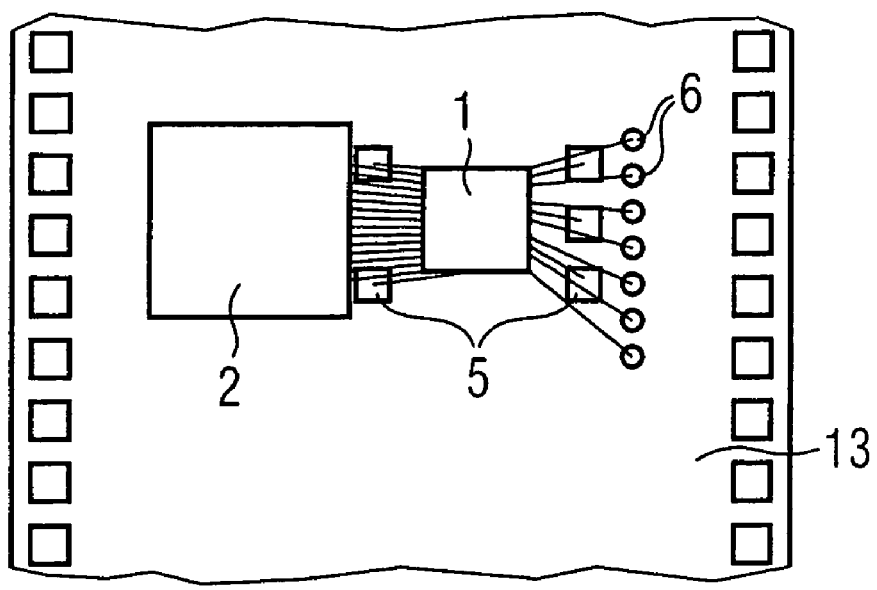
FIG. 16 shows a segment from the top side of the support strip in FIG. 15 with fitted components.

FIG. 16 shows a segment from the top side of the support strip in line with the exemplary embodiment in FIG. 15, with fitted components in line with FIG. 2.

Figure 17:
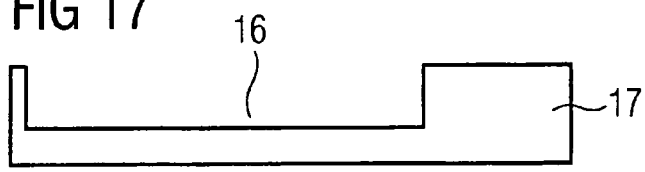
FIG. 17 shows a cross section through a housing provided for an SD Card.

FIG. 17 shows a cross section of a housing 17 (standardized for SD Cards) of thickness 1.4 mm which is provided with a cutout 16 which has the dimensions corresponding to those of the module 3 or slightly larger, particularly a depth of 0.76 mm, and into which the module 3 is inserted.

Figure 18:
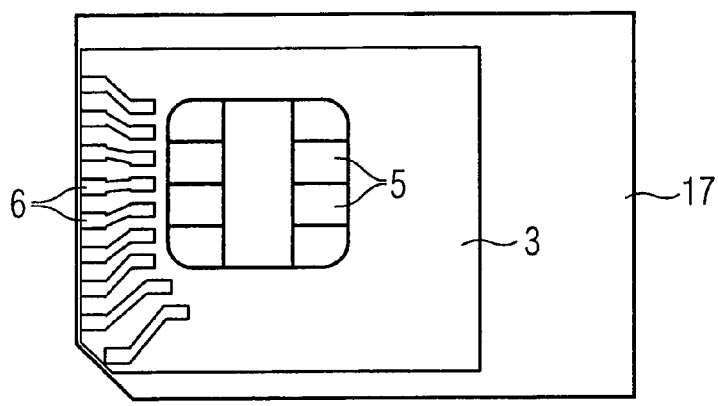
FIG. 18 shows a plan view of the housing provided for an SD Card, with an inserted module.

FIG. 18 shows, in line with FIG. 10, the housing 17 in plan view with the inserted module 3, the connection pads 5 and the further connection pads 6 being arranged on the outer side of the housing 17. At the edge of the module, the further connection pads 6 provided for the functionality of the SD Card already have the dimensions corresponding to the associated standard. Conductor tracks on the top side of the module 3 can be provided for electrically connecting the further connection pads 6 to bonding pads fitted further inside so that the electrical connections of the microcontroller component 1 and of the memory component 2 can be connected to the further connection pads 6 by means of short bonding wires.

Figure 19:
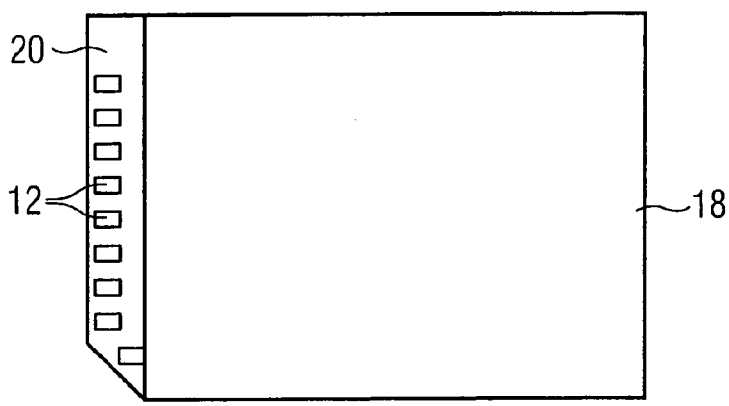
FIG. 19 shows a plan view of the top side of the finished security SD Card.

On the free top side of the module 3, a cover 18 is fitted, as FIG. 19 shows in plan view, which covers the connection pads 5 in line with the smart cards' standard and complements the housing 17 up to the thickness of 2.1 mm provided for SD Cards. In the region of the further connection pads 6, the cover 18 has a beveled part 20 which forms a kind of lattice with respective openings above the further connection pads 6, so that it is possible to provide the external connection pads 12 corresponding to the SD Cards' standard at this point.

Figure 20:
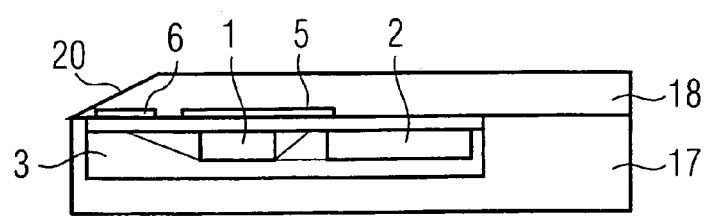
FIG. 20 shows a cross section through the security SD Card.

FIG. 20 shows the finished security SD Card in a cross section. The position of the module 3 inside the housing 17 and the beveled part 20 of the cover 18 above the further connection pads 6 can be seen therein. This exemplary embodiment therefore affords the option of designing the further connection pads 6 provided on the module 3 such that they already correspond to the SD Card's standard and can be arranged at the edge of the housing 17 as external connection pads 12 for external electrical connection. The connection pads 5 used for personalization can easily be covered by a cover made of plastic or the like which does not have dedicated electrical conductors, since the SD Card's standard provides for a housing thickness of 2.1 mm, while the external connection pads on the SD Card need to be arranged in the position corresponding to the MultiMediaCard in line with a card thickness of 1.4 mm. It is therefore not necessary to use conductors in the cover for the purpose of electrically connecting the further connection pads 6 on the module 3, which are already correctly positioned, to separately fitted external connection pads.

What is claimed is:

1. A security memory card comprising:
   a microcontroller; and
   a memory having a large storage capacity, wherein the microcontroller and the memory are arranged in a module having a standard thickness consistent with a format standardized for external dimensions of smart cards and lateral dimensions which are reduced in comparison with such a format,
   wherein the module is arranged in a housing having external dimensions corresponding to a format standardized for a memory card, has first connection pads consistent with a format standardized for smart cards and second connection pads consistent with a functionality provided for the memory card, and is personalized for limiting use authorization and/or for allowing identification; and
   wherein the housing has external memory card connections, which are electrically connected to the second connection pads or are formed by the second connection pads, as the only external connections.

2. The security memory card as claimed in claim 1, wherein the module is formed from a portion of a smart card.

3. The security memory card as claimed in claim 1, wherein the format standardized for smart cards is ID-1 or ID-000 from ISO7816.

4. The security memory card as claimed in claim 1, further comprising a cutout formed in the housing to hold the module and a cover covering the first connection pads.

5. The security memory card as claimed in claim 4, further comprising:
   contacts provided on an inner side of the housing and/or the cover facing the module to provide electrical connections for the second connection pads in the module; and
   external connection pads provided on an outer side of the housing and/or the cover to provide electrical connections to the contacts.

6. The security memory card as claimed in claim 1, wherein the security memory card has external dimensions and external connection pads of the format of a Multimedia Card.

7. The security memory card as claimed in claim 1, wherein the security memory card has external dimensions and external connection pads of the format of an SD Card.

8. A method for producing a security memory card, in which a housing standardized for a memory card contains a microcontroller and a memory having a large storage capacity, the method comprising the steps of:
   providing a support with first connection pads consistent with a format standardized for smart cards and also second connection pads consistent with a functionality provided for the memory card;
   mounting the microcontroller and the memory on the support and electrically connecting the microcontroller and the memory to the first connection pads and to the second connection pads;
   cutting the support out as a chip card module;
   fitting the chip card module in a card body whose external dimensions substantially correspond to a format standardized for smart cards;
   personalizing the chip card module to limit use authorization and/or to allow identification; and
   fitting the card body in a cutout in a housing which provides external connection pads, which are electrically connected to the second connection pads or are formed by the second connection pads, as the only external connections on the housing, wherein external dimensions of the housing and the external connection pads correspond to a format standardized for the memory card.

9. The method as claimed in claim 8, further comprising the step of:
   providing the cutout with a cover having the external connection pads on an external top side facing away from the chip card module, wherein the external connection pads are electrically connected to the second connection pads in the chip card module.

10. The method as claimed in claim 9, wherein the cover is a printed circuit board having contacts on an inner side facing the chip card module for electrically connecting to the second connection pads, and the contacts are electrically connected to the external connection pads.

11. The method as claimed in claim 8, further comprising the step of reducing the external dimensions of the card body to fit the card body in the cutout in the housing.

* * * * *

UNITED STATES PATENT AND TRADEMARK OFFICE
CERTIFICATE OF CORRECTION

PATENT NO. : 7,121,473 B2 Page 1 of 1
APPLICATION NO. : 10/769286
DATED : October 17, 2006
INVENTOR(S) : Thorsten Boker It is certified that error appears in the above-identified patent and that said Letters Patent is hereby corrected as shown below:

On the cover page, item (73) Assignee:

"Infeneon Technologies Flash GmbH & Co." should read --Infineon Technologies Flash GmbH & Co.--.

Signed and Sealed this

Second Day of January, 2007

JON W. DUDAS
*Director of the United States Patent and Trademark Office*